(12) United States Patent
Matsuda

(10) Patent No.: US 6,956,290 B2
(45) Date of Patent: Oct. 18, 2005

(54) FLIP-CHIP BGA SEMICONDUCTOR DEVICE FOR ACHIEVING A SUPERIOR CLEANING EFFECT

(75) Inventor: Motoaki Matsuda, Kumamoto (JP)

(73) Assignee: NEC Electronics Corporation, Kanagawa (JP)

(*) Notice: Subject to any disclaimer, the term of this patent is extended or adjusted under 35 U.S.C. 154(b) by 126 days.

(21) Appl. No.: 10/659,379

(22) Filed: Sep. 11, 2003

(65) Prior Publication Data

US 2004/0051182 A1 Mar. 18, 2004

(30) Foreign Application Priority Data

Sep. 12, 2002 (JP) ........................................ 2002-266695

(51) Int. Cl.⁷ ............................ H01I 23/48; H01I 23/52; H01L 29/40
(52) U.S. Cl. .................................................... 257/777
(58) Field of Search ................................ 257/777, 778, 257/783; 438/51, 55, 64, 106, 108, 118, 119

(56) References Cited

U.S. PATENT DOCUMENTS

| 5,846,851 A | * | 12/1998 | Sasaki et al. | ............... 438/118 |
| 6,224,711 B1 | * | 5/2001 | Carden et al. | ............... 156/311 |
| 6,268,646 B1 | * | 7/2001 | Sugimoto et al. | ........... 257/673 |
| 6,391,686 B1 | * | 5/2002 | Shiozawa | ................... 438/118 |

FOREIGN PATENT DOCUMENTS

| JP | 3-56137 A | 5/1991 |
| JP | 10-41350 A | 2/1998 |
| JP | 11-284032 A | 10/1999 |

* cited by examiner

Primary Examiner—David Nhu
(74) Attorney, Agent, or Firm—Sughrue Mion, PLLC

(57) ABSTRACT

In the flip-chip BGA semiconductor device of the present invention, a stiffener is bonded by means of adhesive on the surface of a substrate on which a semiconductor chip is mounted in the area surrounding the semiconductor chip, and gaps are provided between the substrate and the stiffener that each extend outwardly from positions that confront opposite sides of the semiconductor chip and that communicate with the ends of the substrate. These gaps can be formed by depressions that are provided in the substrate or in the stiffener.

16 Claims, 6 Drawing Sheets

FLIP-CHIP BGA SEMICONDUCTOR DEVICE FOR ACHIEVING A SUPERIOR CLEANING EFFECT

BACKGROUND OF THE INVENTION

1. Field of the Invention

The present invention relates to a semiconductor device, and more particularly to a flip-chip BGA (Ball Grid Array) semiconductor device.

2. Description of the Related Art

In the process of assembling a flip-chip BGA, the substrate is normally cleaned after soldering IC chips to the substrate by means of balls. If this cleaning is inadequate, substances such as flux that is used in soldering will not be completely removed from the substrate, and these substances will remain as a residue on the substrate surface or chip surface. This residue is one factor that can cause a decrease in the assembly yield.

Japanese Patent Laid-Open Publication No. H10-041350 discloses one substrate cleaning method of the prior art. In this method, enclosure walls 121 are provided around a cleaning area that includes the mounting area of semiconductor chip 114 on substrate 111, as shown in FIG. 1 and FIG. 2. Cleaning fluid 131 flows into the space that is enclosed by enclosure walls 121. Aperture 116 is formed in the bottom surface of substrate 111, and cleaning fluid 131 that has flowed in is discharged from aperture 116. At this time, cleaning fluid 131 that flows toward aperture 116 flows through gaps between contact pads 115 that are arranged between semiconductor chip 114 and substrate 111, and this flow of cleaning fluid 131 produces the cleaning effect.

It has now been discovered that this cleaning method has the following problems:

(1) To obtain an increased cleaning effect, a rapid flow of cleaning fluid 131 between semiconductor chip 114 and substrate 111 is advantageous, but cleaning routes 141 are not straight, and a rapid flow of cleaning fluid 131 is therefore difficult to achieve.

(2) A cleaning process cannot be performed for vertically stacked substrates 111, and the production efficiency is therefore impaired.

(3) The necessity of forming aperture 116 in the middle of substrate 111 reduces the area that can be used for routing lines on substrate 111 and thus restricts the freedom of line routing.

In the prior art, an adequate cleaning effect could not be obtained due to the above-described points (1) and (2), and residue therefore tended to remain on substrate 111. Residue that remains may prevent underfill resin, which is subsequently injected between substrate 111 and semiconductor chip 114, from achieving adequate bonding with substrate 111 or semiconductor chip 114, and therefore may cause defects in the close adhesion of the underfill resin.

SUMMARY OF THE INVENTION

It is an object of the present invention to provide a flip-chip BGA semiconductor device of a construction that enables adequate cleaning following soldering of a chip to the substrate by means of balls in order to improve the assembly yield of a flip-chip BGA semiconductor device.

The flip-chip BGA semiconductor device of the present invention is constructed with a semiconductor chip mounted on the substrate by a reflow process. A stiffener is bonded by means of an adhesive to the area surrounding the semiconductor chip on the surface of the substrate on which the semiconductor chip is mounted. Gaps are provided between this stiffener and the substrate that each extend outwardly from positions that confront opposite sides of the semiconductor chip and that communicate with the ends of the flip-chip BGA semiconductor device.

In this flip-chip BGA semiconductor device, when cleaning fluid is caused to flow from the side of one gap to the side of the other gap, the cleaning fluid passes through one gap, flows between the semiconductor chip and substrate, and is discharged from the other gap, during which time the flow is virtually unhindered and the force of the cleaning fluid therefore maintained. As a result, cleaning fluid can easily be caused to flow at high speed between the semiconductor chip and substrate, and an increased cleaning effect can therefore be obtained.

In addition, this cleaning method maintains this effect even when cleaning a plurality of stacked flip-chip BGA semiconductor devices, and the method therefore both allows effective cleaning of a multiplicity of flip-chip BGA semiconductor devices and achieves greater production efficiency.

In the present invention, at least one of the gaps on two sides of a semiconductor chip is preferably provided across the width of a side of the semiconductor chip that the gap confronts. This constructions allows cleaning fluid to flow effectively over the entire extent of the bonding portion of the semiconductor chip and the substrate, and can therefore obtain an excellent cleaning effect throughout the entire area.

The gaps between the substrate and the stiffener may be formed by providing depressions in the substrate, or may be formed by providing depressions in the stiffener. In the latter case, it is also possible not to provide adhesive in portions in which the depressions are formed, whereby the gaps can be made larger and the cleaning fluid can be caused to flow more easily. In any case, wiring can be provided even in areas of the substrate in which the gaps are provided, and the degree of freedom in routing wiring is therefore not restricted.

The above and other objects, features, and advantages of the present invention will become apparent from the following description with reference to the accompanying drawings, which illustrate examples of the present invention.

BRIEF DESCRIPTION OF THE DRAWINGS

FIG. 3b is a cross-sectional view taken along line A–A' of FIG. 3a;

FIG. 3c is a cross-sectional view taken along line B–B' of FIG. 3a;

FIG. 5 is a flow chart of the assembly steps that precede and follow the cleaning step of the flip-chip BGA semiconductor device that is shown in FIG. 3a;

FIG. 7b is a sectional view taken along line A–A' of FIG. 7a;

FIG. 7c is a sectional view taken along line B–B' of FIG. 7a;

FIG. 8b is a sectional view taken along line A–A' of FIG. 8a; and

FIG. 8c is a sectional view taken along line B–B' of FIG. 8a.

DETAILED DESCRIPTION OF THE PREFERRED EMBODIMENTS

Figure 3A:
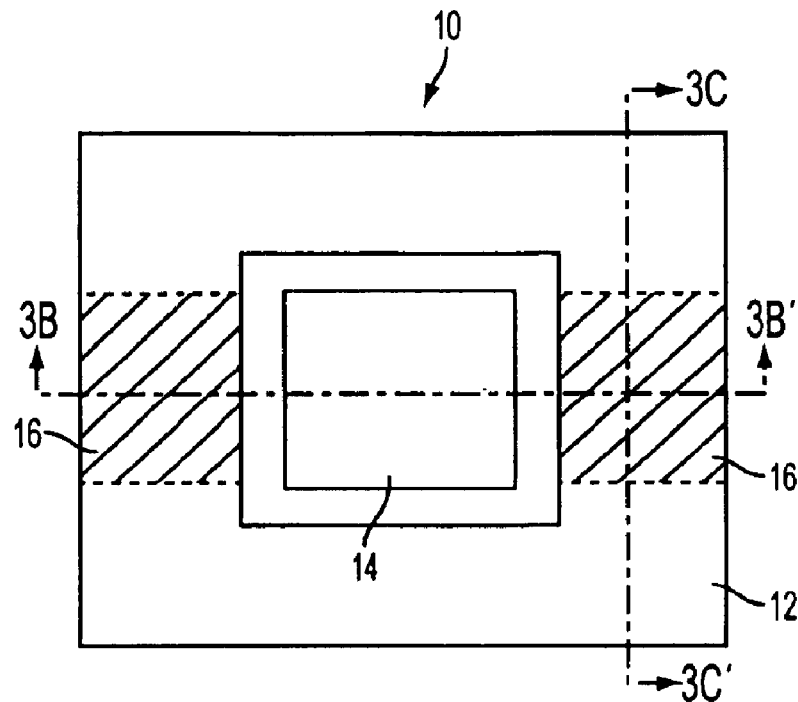
FIG. 3a is a plan view of the flip-chip BGA semiconductor device of the first embodiment of the present invention.
Figure 3B:
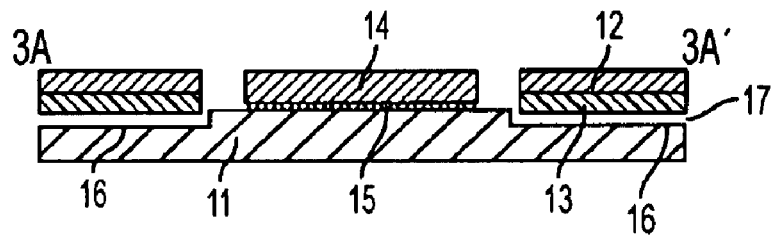
Figure 3C:
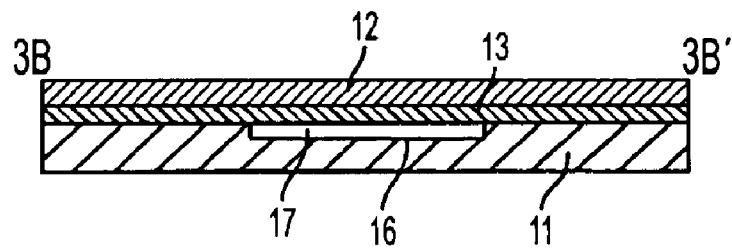
Figure 4:
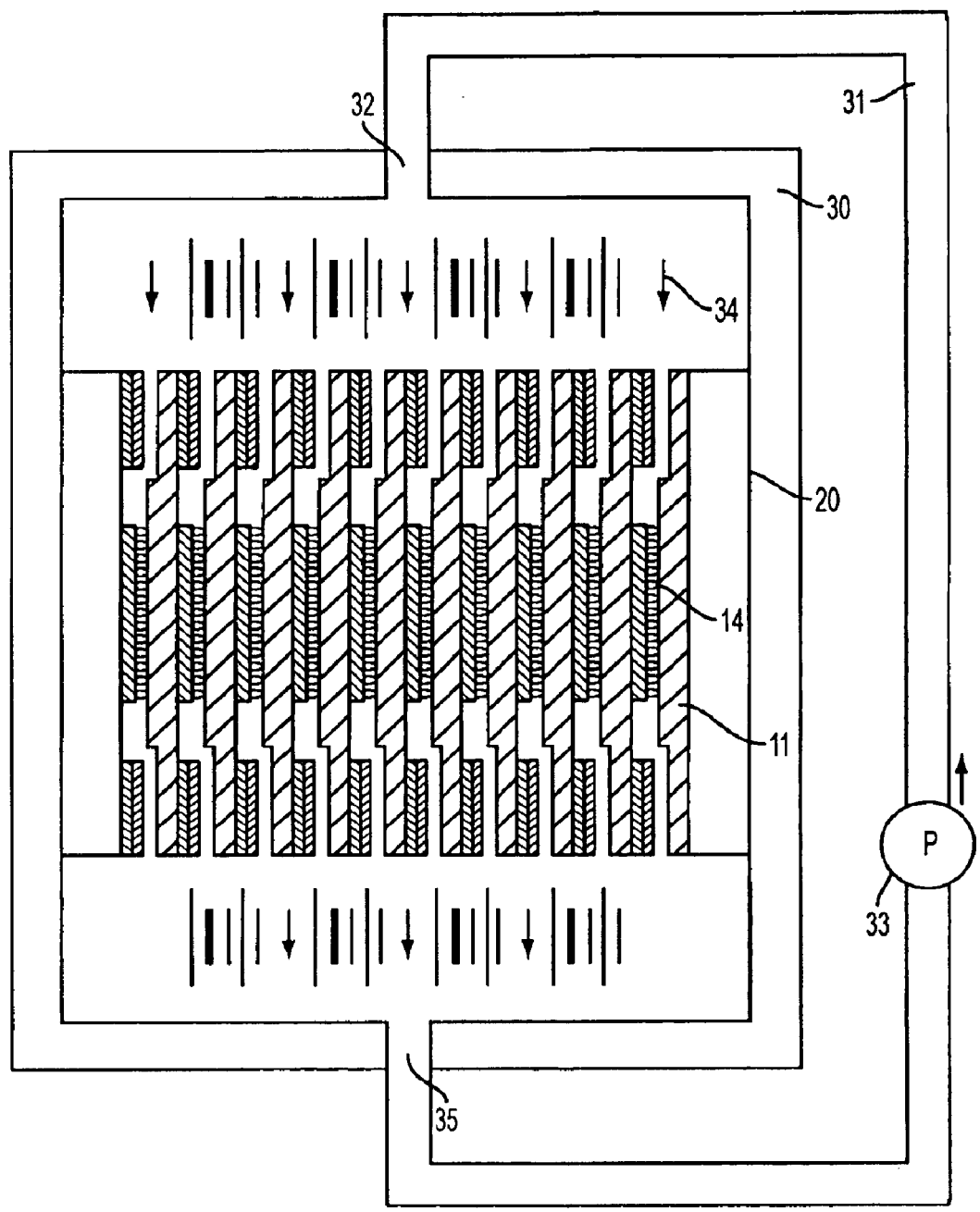
FIG. 4 is a cross-sectional view showing the state of the flip-chip BGA semiconductor device that is shown in FIG. 3a during cleaning.
Figure 5:
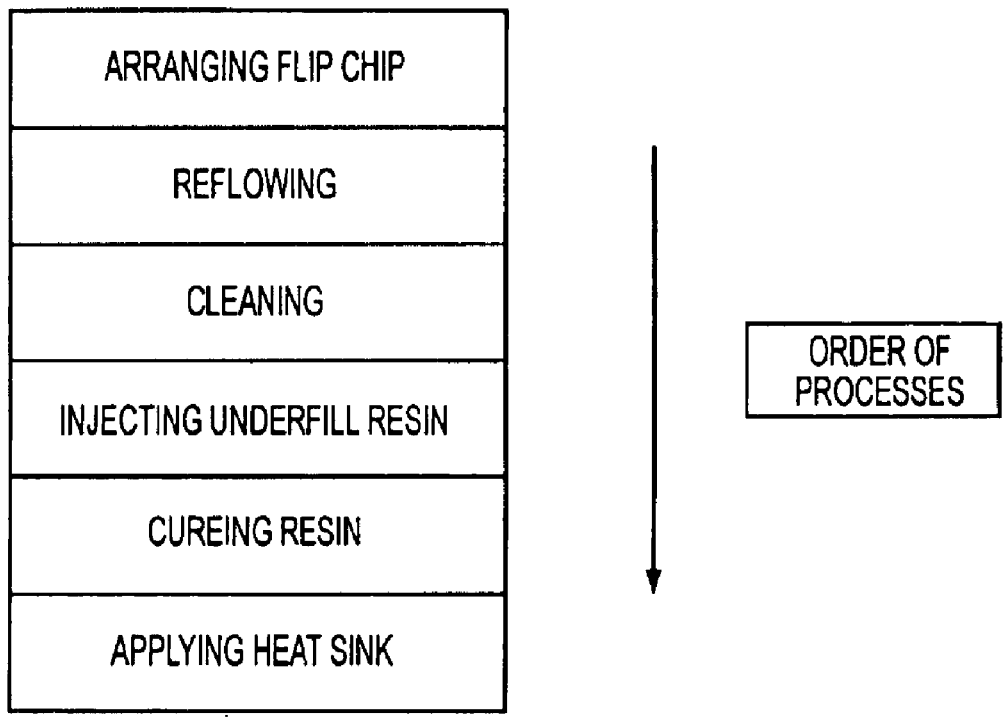

We first refer to FIGS. 3a to 3c, FIG. 4 and FIG. 6 in accompaniment with the flow chart of FIG. 5 to explain the assembly steps of the flip-chip BGA of the first embodiment of the present invention.

To fabricate flip-chip BGA 10, substrate 11 to which stiffener 12 is attached by adhesive 13 is first prepared, as shown in FIGS. 3a to 3c. An epoxy resin or a mixture of an epoxy resin and olefin resin can be used as adhesive 13.

Figure 6:
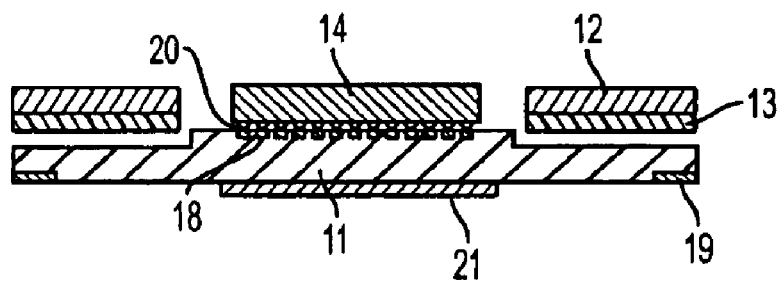
FIG. 6 is a sectional view of the flip-chip BGA semiconductor device for which the assembly steps of FIG. 5 have been completed.

An opening is formed in stiffener 12 in the vicinity of the center of substrate 11, and electrodes 18 for connecting the semiconductor chip are arranged in the portion of the surface of substrate 11 that is exposed by this opening, as shown in FIG. 6. In addition, electrodes 19 for connecting to the outside are arranged on the surface of the side of substrate 11 that is opposite the surface on which stiffener 12 is attached; and electrodes 18 for connecting to a semiconductor chip and electrodes 19 for connecting to the outside are connected by way of wired circuits (not shown in the figure) that are provided on substrate 11.

Depressions 16 are provided on the surface of substrate 11 on which stiffener 12 is attached, whereby gaps 17 are formed between substrate 11 and adhesive 13 that is bonded to stiffener 12. As gaps 17, passages that pass from one side of flip-chip BGA 10 and through the opened portion of stiffener 12 are provided on the two opposing sides with this opening interposed.

Semiconductor chip 14 is next arranged in the opening of stiffener 12 and then bonded by a reflow process (soldering) to semiconductor chip connection electrodes 18 by means of balls 15, whereby semiconductor chip 14 is mounted.

In the cleaning step that follows, a plurality of similar flip-chip BGAs 10 are stacked and loaded in cassette 20 as shown in FIG. 4 and then conveyed into cleaning tank 30. Circulation piping provided with pump 33 is connected to cleaning tank 30 with inflow port 32 into cleaning tank 30 and outflow port 35 from cleaning tank 30 being provided at opposite positions of cleaning tank 30. Cassette 20 is arranged such that, of gaps 17 that are formed by depressions 16 in substrate 11 for each flip-chip BGA 10, gap 17 that is located on one side of semiconductor chip 14 confronts the inflow port 32 side and gap 17 located on the other side confronts the outflow port 35 side.

With the activation of pump 33, cleaning fluid/cleaning water 31 that is under pressure from pump 33 becomes jet current 34 and flows through cleaning tank 30. This jet current 34 enters each flip-chip BGA 10 through gaps 17 on the inflow port 32 side that are formed by depression 16 in substrate 11, passes through the spaces between balls 15 that are arranged between semiconductor chips 14 and substrates 11, and is discharged from the gaps on the outflow port 35 side.

The cleaning of flip-chip BGA 10 is thus carried out by, for example, the flow of glycol cleaning fluid/cleaning water 31 at a fluid temperature of 50 to 70° C. and a flow rate of approximately 600 liters/minute over a period of 1800 seconds.

In this way, substances such as flux that adhered to substrate 11 during the reflow process to bond (solder) semiconductor chip 14 to substrate 11 are effectively removed, and the surfaces of substrate 11 and semiconductor chip 14 are cleaned without any residue being left behind.

Underfill resin 22 is then injected between semiconductor chip 14 and substrate 11, and heat sink 21 is applied to the side of substrate 11 that is opposite the side on which semiconductor chip 14 is mounted. Underfill resin 22 adheres well to the surfaces of substrate 11 and semiconductor chip 14 because both surfaces have been effectively cleaned.

Figure 7A:
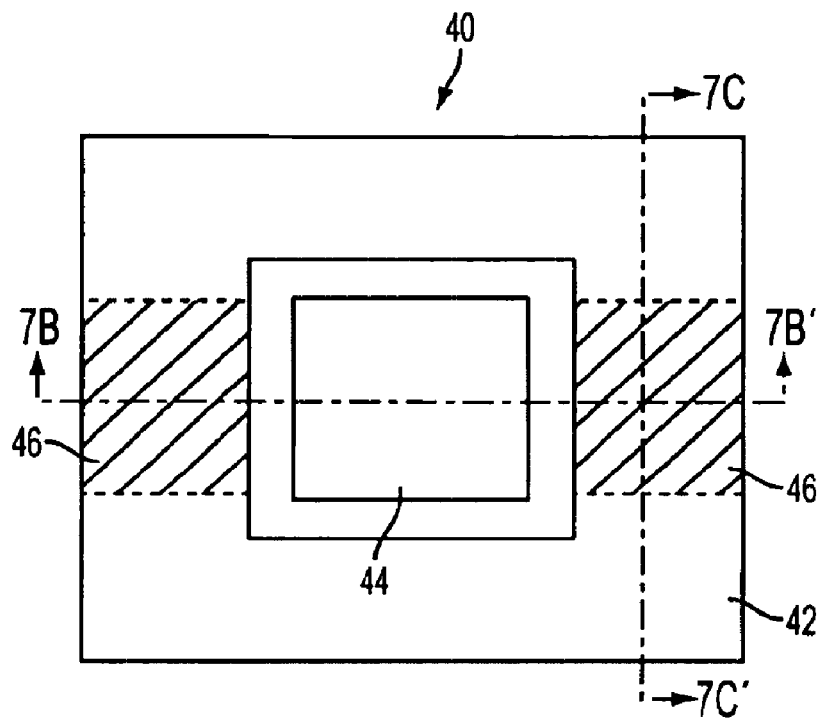
FIG. 7a is a plan view of the flip-chip BGA semiconductor device according to the second embodiment of the present invention.
Figure 7B:
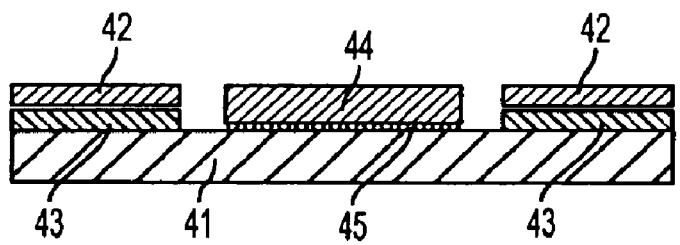
Figure 7C:
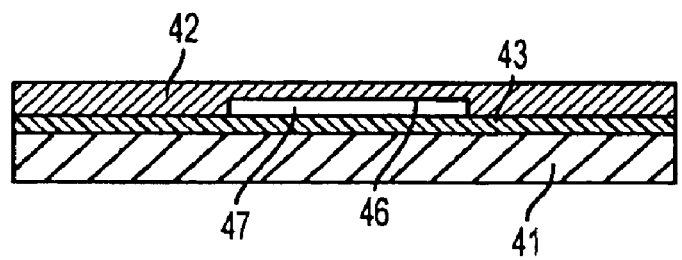

We next refer to FIGS. 7a to 7c to describe the flip-chip BGA according to the second embodiment of the present invention.

In contrast to flip-chip BGA 10 of the first embodiment in which depressions 16 were provided in substrate 11 to form gaps 17, in the present embodiment, depressions 46 are provided in stiffener 42 to form gaps 47.

As in the first embodiment, as gaps 47, passages that communicate with the opening of stiffener 42 for mounting semiconductor chip 44 are provided on two opposing sides with the opening interposed.

Figure 1:
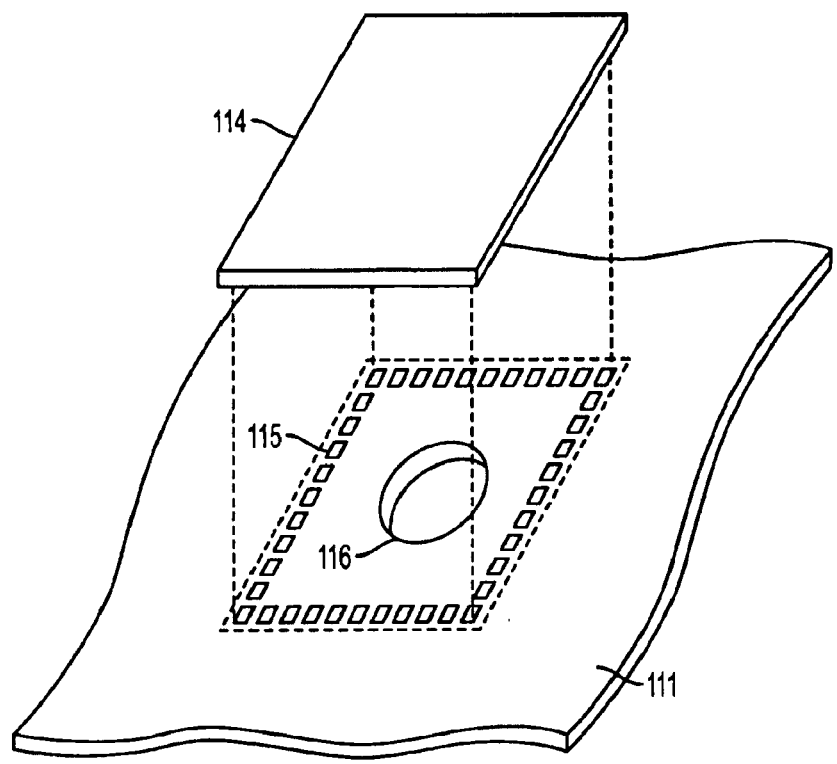
FIG. 1 is an exploded perspective view of a flip-chip BGA semiconductor device of the prior art.
Figure 2:
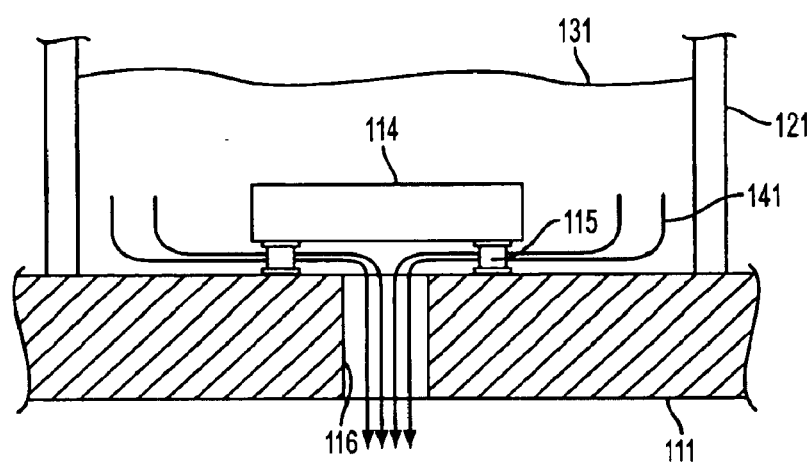
FIG. 2 is a cross-sectional view showing the state of the flip-chip BGA semiconductor device of FIG. 1 during cleaning.

Flip-chip BGAs 40 of this embodiment can also be cleaned in cleaning tank 30 that is shown in FIG. 2. In this case, flip-chip BGAs 40 of this embodiment are configured such that jet current 34 that passes through gap 47 between stiffener 42 and substrate 41 (adhesive 43) advances directly to strike against semiconductor chip 44, whereby jet current 34 can be directed substantially directly toward the spaces between balls 45, whereby an excellent cleaning effect can be obtained.

Figure 8A:
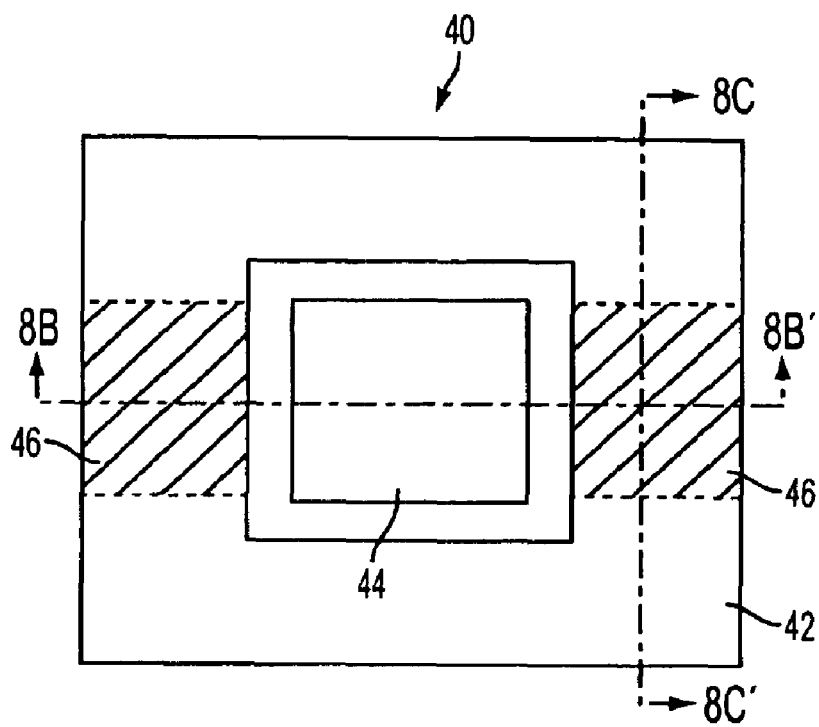
FIG. 8a is a plan view of the flip-chip BGA semiconductor device according to a modification of the second embodiment of the present invention.
Figure 8B:
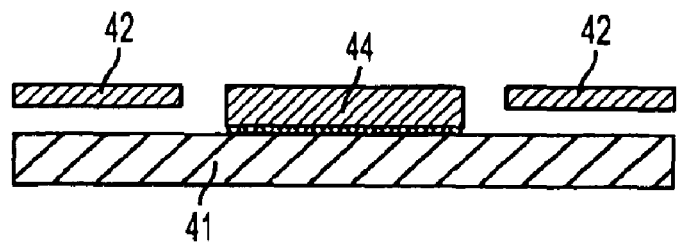
Figure 8C:
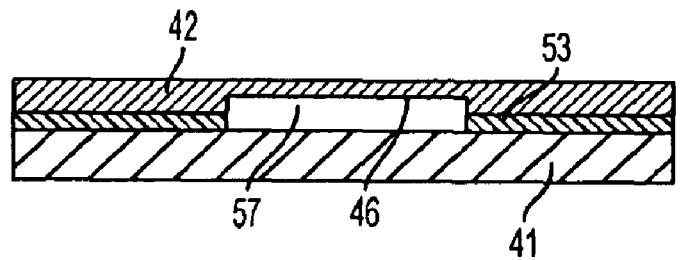

Moreover, as a modification of flip-chip BGA 40 of the second embodiment, a construction may be adopted in which depressions 46 are provided in portions of stiffener 42, and further, adhesive 53 is not provided in these portions, as shown in FIGS. 8a to 8c. This construction enables an enlargement of gaps 57 that are formed between substrate 41 and the depression 46 portions of stiffener 42, and accordingly, can raise the cleaning effect of jet current 34.

As described in the foregoing explanation, in the cleaning step, cleaning fluid/cleaning water 31 becomes jet current 34 that passes through gaps 17, 47 or 57 between substrates 11 and 41 and stiffeners 12 and 42, and then passes between semiconductor chips 14 and 44 and substrates 11 and 41 while substantially maintaining the force of this current, whereby a superior cleaning effect can be obtained, and whereby the space between thin semiconductor chips 14 and 44 and substrates 11 and 41 can be easily and effectively cleaned in a short time period without leaving any soldering flux residue. In addition, the use of this cleaning method enables effective cleaning without any loss of cleaning effect even when the cleaning method is employed for a case in which a plurality of flip-chip BGAs 10 and 40 are stacked and cleaned, and thus can obtain superior production efficiency when mass-producing flip-chip BGAs 10 and 40.

While preferred embodiments of the present invention have been described using specific terms, such description is for illustrative purposes only, and it is to be understood that changes and variations may be made without departing from the spirit or scope of the following claims.

For example, although a case was described in each of the embodiments in which, as gaps 17, 47, and 57, passages of the same shape were formed on the inflow side and outflow side of jet current 34 at symmetric positions with respect to semiconductor chips 14 and 44, the construction need not conform to this configuration. For example, a construction may be adopted in which the width of gaps 17, 47, and 57 on the outflow side of jet current 34 are narrower or wider than on the inflow side, or in which a plurality of gaps 17, 47, and 57 extending in a striped pattern in the direction of flow are provided. In any case, gaps 17, 47, and 57 on at least one side of the two opposite sides that sandwich semiconductor chip 14 are preferably provided across the width of the side of semiconductor chip 14 that these gaps 17, 47, and 57 confront so that jet current 34 flows over the entire area of the connecting portions between semiconductor chip 14 and substrate 11, whereby a superior cleaning effect can be obtained over the entire connecting portion.

What is claimed is:

1. A flip-chip BGA semiconductor device in which a semiconductor chip is mounted on a substrate by a reflow process;
   comprising a stiffener that is bonded by an adhesive to an area surrounding said semiconductor chip on the a surface of said substrate on which said semiconductor chip is mounted;
   wherein gaps are provided between said stiffener and said substrate that each extend outwardly from positions that confront two sides of said semiconductor chip and that communicate with ends of said substrate.

2. A flip-chip BGA semiconductor device according to claim 1, wherein a first gap of said gaps is provided across a width of a first side of said two sides of said semiconductor chip that said first gap confronts.

3. A flip-chip BGA semiconductor device according to claim 1, wherein a first gap and a second gap of said gaps are provided across widths of the two sides of said semiconductor chip that said gaps confront.

4. A flip-chip BGA semiconductor device according to claim 1, wherein said gaps are formed by depressions in the surface of said substrate on which said semiconductor chip is mounted.

5. A flip-chip BGA semiconductor device according to claim 1, wherein said gaps are formed by depressions in a surface of said stiffener that faces said substrate by making portions of said stiffener thinner than other areas.

6. A flip-chip BGA semiconductor device according to claim 5, wherein said adhesive is not provided in portions in which said depressions are formed.

7. A semiconductor device, comprising:
   a substrate;
   a semiconductor chip mounted on a first surface of the substrate by a reflow process;
   a stiffener connected to the first surface of the substrate and laterally surrounding the semiconductor chip;
   a first gap between the stiffener and the substrate extending from a first position adjacent to a first side of the semiconductor chip to a first lateral side of the substrate.

8. The semiconductor device of claim 7, further comprising a second gap between the stiffener and the substrate extending from a second position adjacent to a second side of the semiconductor chip to a second lateral side of the substrate.

9. The semiconductor device of claim 8, wherein the first and second sides of the semiconductor chip are opposite sides.

10. The semiconductor device of claim 7, wherein the first gap comprises a first depression formed in the first surface of the substrate.

11. The semiconductor device of claim 7, wherein the first depression extends closer to the semiconductor chip than a portion of the stiffener arranged above the first depression.

12. The semiconductor device of claim 7, wherein an adhesive connects the stiffener and the first surface of the substrate.

13. The semiconductor device of claim 7, wherein the first gap comprises a first depression formed in a first surface of the stiffener facing the first surface of the substrate.

14. The semiconductor device of claim 13, wherein an adhesive connects the stiffener and the first surface of the substrate, except that no adhesive is provided between the first depression in the first surface of the stiffener and the first surface of the substrate.

15. The semiconductor device of claim 7, wherein a width of the first gap, measured in a direction perpendicular to its direction of extension, is equal to a width of the first side of the semiconductor chip.

16. The semiconductor device of claim 7, wherein the semiconductor device is a flip chip BGA semiconductor device.

* * * * *